(12) United States Patent
Wan

(10) Patent No.: US 8,892,157 B2
(45) Date of Patent: Nov. 18, 2014

(54) INTEGRATED PASSIVE DEVICE WITH ELECTROSTATIC DISCHARGE PROTECTION MECHANISM

(71) Applicant: RichWave Technology Corp., Taipei (TW)

(72) Inventor: Kuang-Lieh Wan, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 227 days.

(21) Appl. No.: 13/714,409

(22) Filed: Dec. 14, 2012

(65) Prior Publication Data

US 2013/0157595 A1    Jun. 20, 2013

(30) Foreign Application Priority Data

Dec. 16, 2011  (TW) .............................. 100146836 A

(51) Int. Cl.
| | | |
|---|---|---|
| *H04B 1/10* | (2006.01) | |
| *H04M 1/00* | (2006.01) | |
| *H03F 3/04* | (2006.01) | |
| *H03F 3/191* | (2006.01) | |
| *H04B 1/38* | (2006.01) | |
| *H01L 27/02* | (2006.01) | |

(52) U.S. Cl.
CPC .......... *H04B 1/3888* (2013.01); *H01L 27/0255* (2013.01); *H01L 27/0288* (2013.01)
USPC ......... 455/550.1; 455/306; 375/350; 330/303

(58) Field of Classification Search
USPC ................ 455/77, 550.1, 213, 299, 306, 307; 375/143, 152, 350; 330/303
See application file for complete search history.

(56) References Cited

U.S. PATENT DOCUMENTS

| | | | |
|---|---|---|---|
| 2005/0041347 A1* | 2/2005 | Khorram ......................... 361/56 |
| 2005/0197095 A1* | 9/2005 | Nakamata et al. ............ 455/403 |
| 2005/0219010 A1* | 10/2005 | Erb ................................ 333/126 |
| 2007/0190954 A1* | 8/2007 | Murakami et al. ............ 455/132 |
| 2010/0052813 A1* | 3/2010 | Okabe ........................... 333/132 |
| 2011/0092246 A1* | 4/2011 | Ginsburg et al. .......... 455/550.1 |
| 2011/0128092 A1* | 6/2011 | Fritz et al. ...................... 333/133 |
| 2012/0309335 A1* | 12/2012 | Lee et al. ....................... 455/217 |
| 2012/0322393 A1* | 12/2012 | Lindberg et al. ................ 455/77 |
| 2013/0016447 A1* | 1/2013 | Kitabata et al. ................. 361/56 |
| 2013/0021113 A1* | 1/2013 | Bakalski et al. ............... 333/176 |
| 2013/0083439 A1* | 4/2013 | Hayakawa ....................... 361/56 |

(Continued)

FOREIGN PATENT DOCUMENTS

| | | |
|---|---|---|
| CN | 1130795 C | 12/2003 |
| CN | 1508903 A | 6/2004 |

(Continued)

*Primary Examiner* — Andrew Wendell
(74) *Attorney, Agent, or Firm* — Winston Hsu; Scott Margo

(57) ABSTRACT

An integrated passive device with electrostatic discharge protection mechanism includes an antenna terminal for receiving and transmitting a wireless signals, a first frequency terminal for receiving and transmitting a signal with a first frequency, a first filtering circuit for filtering the wireless signal, and an electrostatic discharge protection element for conducting static electricity to ground. The first filtering circuit includes a first filtering element with a first end electrically connected to the antenna terminal, a second filtering element with a first end electrically connected to a second end of the first filtering element and a second end electrically connected to the first frequency terminal, and a third filtering element with a first end electrically connected to the second end of the first filtering element and a second end electrically connected to ground. The electrostatic discharge protection element is coupled between the second end of the first filtering element and ground.

13 Claims, 5 Drawing Sheets

(56) References Cited

U.S. PATENT DOCUMENTS

2013/0154761 A1* 6/2013 Ilkov .......................... 333/101
2013/0272176 A1* 10/2013 Uejima ....................... 370/282

FOREIGN PATENT DOCUMENTS

| | | |
|---|---|---|
| CN | 101286059 A | 10/2008 |
| EP | 0 687 030 A1 | 12/1995 |
| TW | 200515583 | 5/2005 |
| TW | M343968 | 11/2008 |
| TW | 200849758 | 12/2008 |
| TW | 201011888 | 3/2010 |
| TW | 201105181 | 2/2011 |

* cited by examiner

INTEGRATED PASSIVE DEVICE WITH ELECTROSTATIC DISCHARGE PROTECTION MECHANISM

BACKGROUND OF THE INVENTION

1. Field of the Invention

The present invention relates to an integrated passive device, and more particularly, to an integrated passive device with an electrostatic discharge protection mechanism.

2. Description of the Prior Art

Please refer to FIG. 1. FIG. 1 is a diagram showing an electrostatic discharge protection mechanism of an integrated passive device. The integrated passive device 100 is a duplexer filter. The integrated passive device 100 comprises an antenna terminal 110, a first frequency terminal 120, a first filtering circuit 130, a second frequency terminal 140, and a second filtering circuit 150. The antenna terminal 110 is for receiving and transmitting a wireless signal. The first frequency terminal 120 is for receiving and transmitting a signal with a first frequency, such as a signal with a 2 GHz frequency. The second frequency terminal 140 is for receiving and transmitting a signal with a second frequency, such as a signal with a 5 GHz frequency. The first filtering circuit 130 comprises capacitor and inductor elements for filtering the wireless signal for allowing the signal with the first frequency to be received by the first frequency terminal 120. The second filtering circuit 150 also comprises capacitor and inductor elements for filtering the wireless signal for allowing the signal with the second frequency to be received by the second frequency terminal 140. As shown in FIG. 1, in order to prevent the capacitor elements of the first filtering circuit 130 and the second filtering circuit 150 from being damaged by static electricity, an electrostatic discharge protection element 160 is electrically connected to the antenna terminal 110. The electrostatic discharge protection element 160 comprises a plurality of diodes electrically connected to each other in series for conducting the static electricity to ground.

Please refer to FIG. 2. FIG. 2 is a diagram showing an electrostatic discharge protection mechanism of another integrated passive device. The integrated passive device 200 is a harmonic filter. The integrated passive device 200 comprises an antenna terminal 210, a predetermined frequency terminal 220, and a filtering circuit 230. The antenna terminal 210 is for receiving and transmitting a wireless signal. The predetermined frequency terminal 220 is for receiving and transmitting a signal with a predetermined frequency, such as a signal with a 2.5 GHz frequency. The filtering circuit 230 comprises capacitor and inductor elements for filtering the wireless signal for allowing the signal with the predetermined frequency to be received by the predetermined frequency terminal 220. Similarly, as shown in FIG. 2, in order to prevent the capacitor elements of the filtering circuit 230 from being damaged by the static electricity, an electrostatic discharge protection element 260 is electrically connected to the antenna terminal 210. The electrostatic discharge protection element 260 comprises a plurality of diodes electrically connected to each other in series for conducting the static electricity to ground.

However, according to the above arrangement, the diodes electrically connected to each other in series form a parasitic capacitor, and further affect frequency responses of the filtering circuits 130, 150, 230. For example, the frequency responses of the filtering circuits 130, 150, 230 cannot meet design values at higher frequency. The above arrangements of the electrostatic discharge protection elements of the prior art affect frequency responses of the filtering circuits of the integrated passive devices, such that the frequency responses of the integrated passive devices can not meet design requirements.

SUMMARY OF THE INVENTION

The present invention provides an integrated passive device with electrostatic discharge protection mechanism. The integrated passive device comprises an antenna terminal for receiving and transmitting a wireless signal, a first frequency terminal for receiving and transmitting a signal with a first frequency, a first filtering circuit for filtering the wireless signal, and an electrostatic discharge protection element for conducting static electricity to ground. The filtering circuit comprises a first capacitor with a first end electrically connected to the antenna terminal; a first inductor with a first end electrically connected to the antenna terminal; a second capacitor with a first end electrically connected to a second end of the first capacitor, and a second end electrically connected to the first frequency terminal; a second inductor with a first end electrically connected to the second end of the first capacitor, and a second end electrically connected to the first frequency terminal; a third capacitor with a first end electrically connected to the second end of the first capacitor; and a third inductor with a first end electrically connected to a second end of the third capacitor, and a second end electrically connected to ground. A first end of the electrostatic discharge protection element is electrically connected to the second end of the first capacitor, and a second end of the electrostatic discharge protection element is electrically connected to ground.

In contrast to the prior art, the electrostatic discharge protection element of the integrated passive device of the present invention is electrically connected to the capacitor of the filtering circuit in parallel, such that the influence on frequency response of the filtering circuit is reduced. Therefore, the frequency response of the integrated passive device still can meet the design requirement when utilizing the electrostatic discharge protection mechanism.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
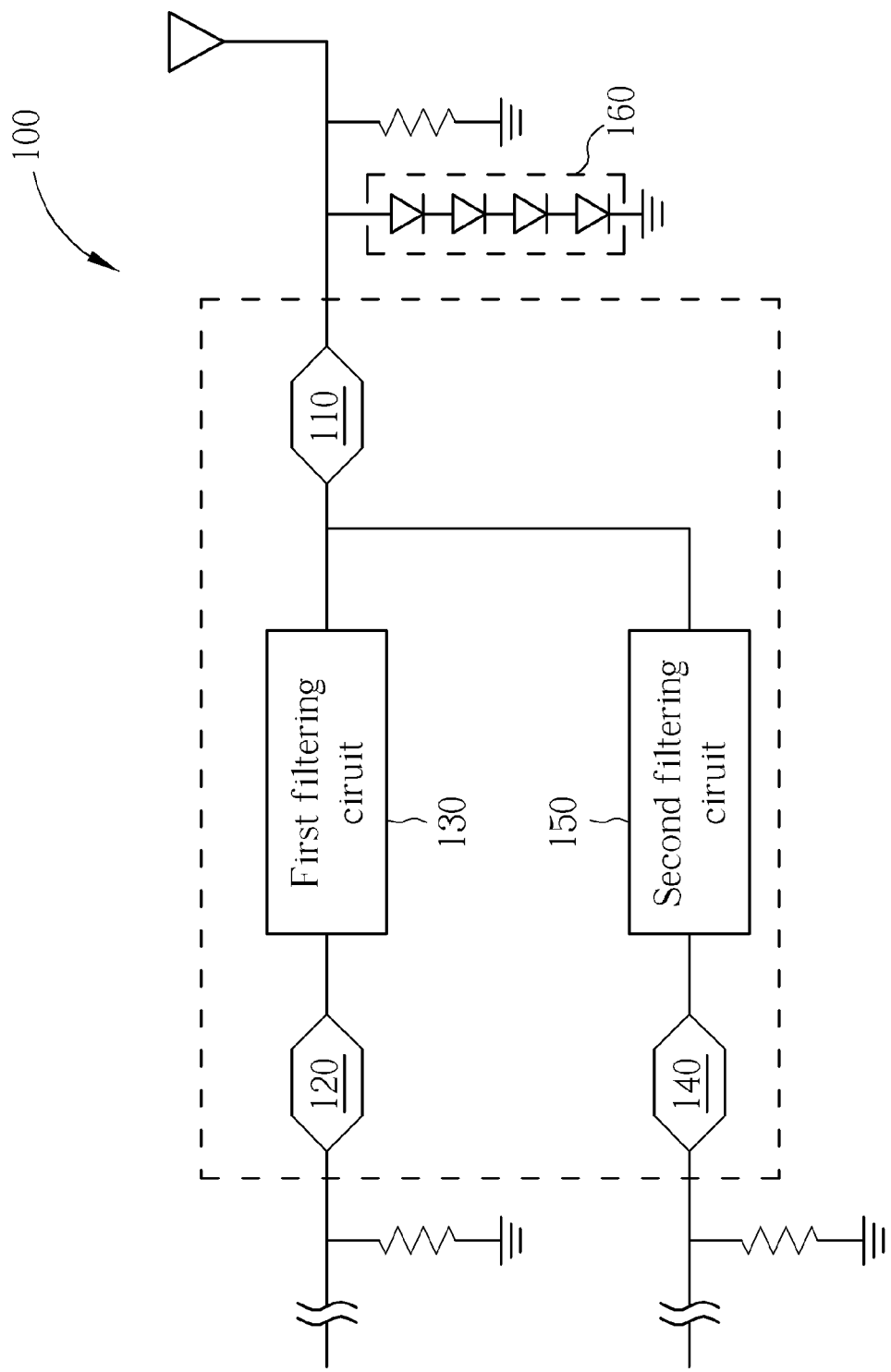
FIG. 1 is a diagram showing an electrostatic discharge protection mechanism of an integrated passive device.
Figure 2:
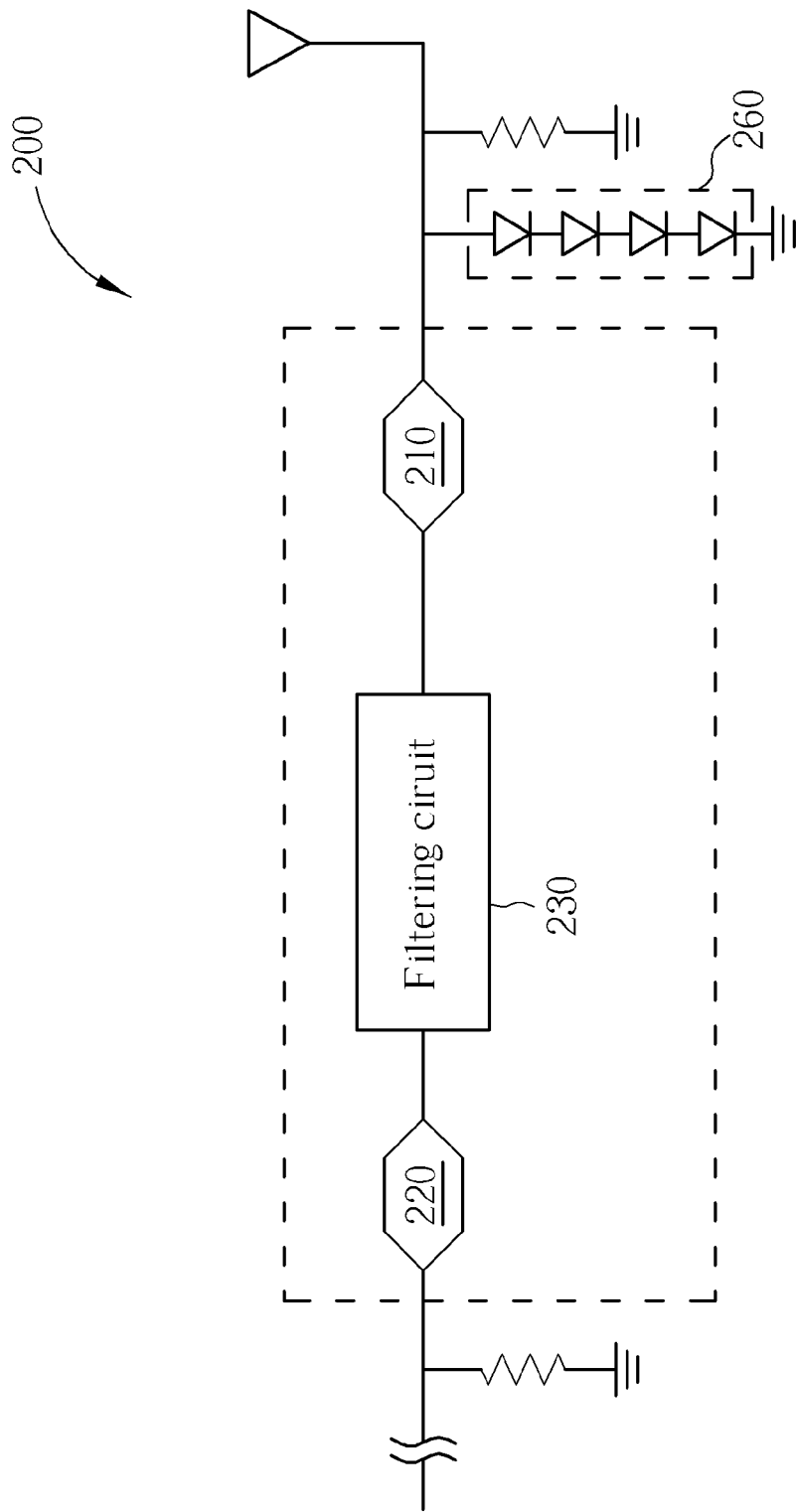
FIG. 2 is a diagram showing an electrostatic discharge protection mechanism of another integrated passive device.
Figure 3:
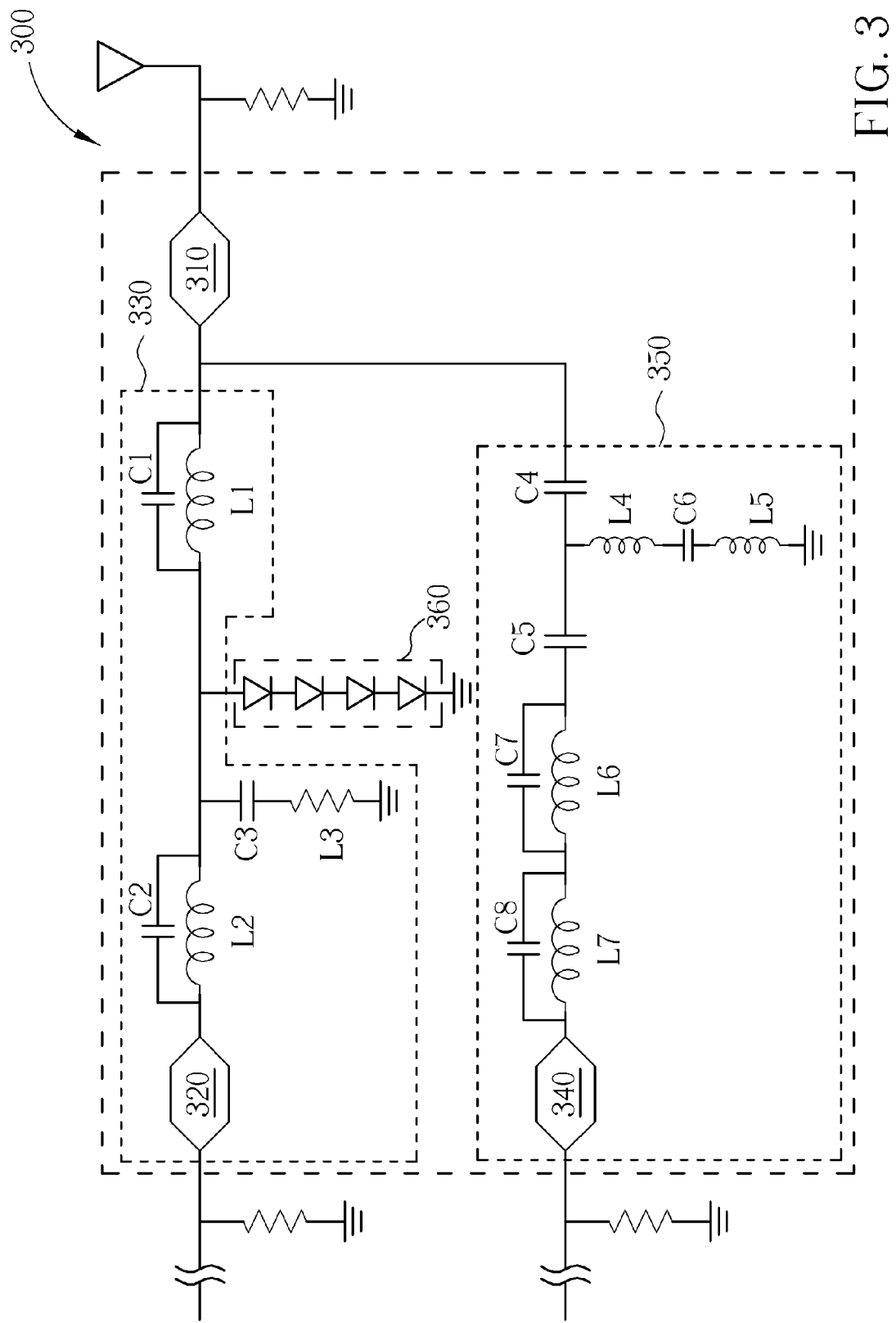
FIG. 3 is a diagram showing an electrostatic discharge protection mechanism of an integrated passive device of the present invention.

Please refer to FIG. 3. FIG. 3 is a diagram showing an electrostatic discharge protection mechanism of an integrated passive device of the present invention. The integrated passive device 300 is a duplexer filter. The integrated passive device 300 comprises an antenna terminal 310, a first frequency terminal 320, a first filtering circuit 330, a second frequency terminal 340, a second filtering circuit 350, and an electrostatic discharge protection element 360. The antenna terminal 310 is for receiving and transmitting a wireless signal. The first frequency terminal 320 is for receiving and transmitting a signal with a first frequency, such as a signal with a 2 GHz frequency. The second frequency terminal 340 is for receiving and transmitting a signal with a second frequency, such as a signal with a 5 GHz frequency. The first filtering circuit 330 is for filtering the wireless signal for allowing the signal with the first frequency to be received by the first frequency terminal 320. The second filtering circuit 350 is for filtering the wireless signal for allowing the signal with the second frequency to be received by the second frequency terminal 340.

As shown in FIG. 3, the first filtering circuit 330 comprises a first capacitor C1, a first inductor L1, a second capacitor C2, a second inductor L2, a third capacitor C3, and a third inductor L3. The first capacitor C1 and the first inductor L1 form a first filtering element. The second capacitor C2 and the second inductor L2 form a second filtering element. The third capacitor C3 and the third inductor L3 form a third filtering element. A first end of the first capacitor C1 is electrically connected to the antenna terminal 310. A first end of the second capacitor C2 is electrically connected to a second end of the first capacitor C1, and a second end of the second capacitor C2 is electrically connected to the first frequency terminal 320. The first inductor L1 is electrically connected to the first capacitor C1 in parallel. The second inductor L2 is electrically connected to the second capacitor C2 in parallel. A first end of the third capacitor C3 is electrically connected to the second end of the first capacitor C1. A first end of the third inductor L3 is electrically connected to a second end of the third capacitor C3, and a second end of the third inductor L3 is electrically connected to ground.

The second filtering circuit 350 comprises a fourth capacitor C4, a fourth inductor L4, a fifth capacitor C5, a fifth inductor L5, a sixth capacitor C6, a sixth inductor L6, a seventh capacitor C7, a seventh inductor L7, and an eighth capacitor C8. The fourth capacitor C4, the fourth inductor L4, the fifth capacitor C5, the fifth inductor L5, and the sixth capacitor C6 form a fourth filtering element. The sixth inductor L6, the seventh capacitor C7, the seventh inductor L7, and the eighth capacitor C8 form the fifth filtering element (the fifth filtering element can only be formed by the sixth inductor L6 and the seventh capacitor C7). A first end of the fourth capacitor C4 is electrically connected to the antenna terminal 310. A first end of the fifth capacitor C5 is electrically connected to a second end of the fourth capacitor C4. A first end of the fourth inductor L4 is electrically connected to the second end of the fourth capacitor C4. A first end of the sixth capacitor C6 is electrically connected to a second end of the fourth inductor L4. A first end of the fifth inductor L5 is electrically connected to a second end of the sixth capacitor C6, and a second end of the fifth inductor L5 is electrically connected to ground. A first end of the seventh capacitor C7 is electrically connected to a second end of the fifth capacitor C5. A first end of the eighth capacitor C8 is electrically connected to a second end of the seventh capacitor C7, and a second end of the eighth capacitor C8 is electrically connected to the second frequency terminal 340. The sixth inductor L6 is electrically connected to the seventh capacitor C7 in parallel. The seventh inductor L7 is electrically connected to the eighth capacitor C8 in parallel.

According to the above arrangement, in order to prevent the capacitor elements C of the filtering circuit 330, 350 from being damaged by the static electricity, the first inductor L1 allows current to pass through in order to protect the first capacitor C1 from the static electricity, and the second inductor L2 allows current to pass through in order to protect the second capacitor C2 from the static electricity. In addition, a first end of the electrostatic discharge protection element 360 is electrically connected to the second end of the first capacitor C1, and a second end of the electrostatic discharge protection element 360 is electrically connected to ground. The electrostatic discharge protection element 360 comprises a plurality of diodes electrically connected to each other in series for conducting the static electricity to ground, in order to protect the third capacitor C3 and the second filtering circuit 350 from the static electricity. Although the diodes of the electrostatic discharge protection element 360 form a parasitic capacitor, the parasitic capacitor formed by the diodes is electrically connected to the third capacitor C3 in parallel, such that the third capacitor C3 and the parasitic capacitor can be seemed as a single capacitor with capacitance equal to summation of capacitance of the third capacitor C3 and the parasitic capacitor. The integrated passive device 300 can adjust the capacitance of the third capacitor C3 to reduce influence of frequency response caused by the parasitic capacitor.

Figure 4:
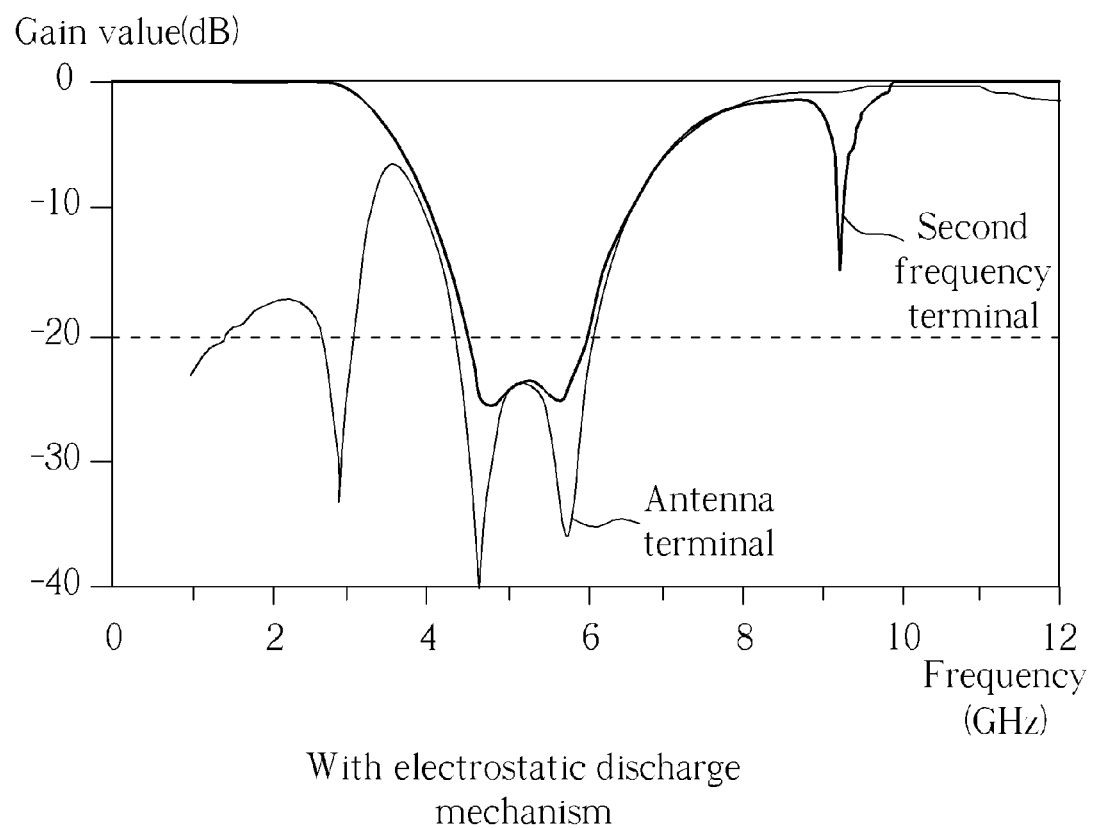
FIG. 4 is a diagram showing frequency responses of the integrated passive device of FIG. 3.

Please refer to FIG. 4. FIG. 4 is a diagram showing frequency responses of the integrated passive device 300 of FIG. 3. Original designed gain values of the frequency responses of the antenna terminal and the second frequency terminal around the frequency of 5 GHz should be lower than −20 dB, and as shown in FIG. 4, when the electrostatic discharge protection element 360 is electrically connected to the third capacitor C3 in parallel, the gain values of the frequency responses of the antenna terminal and the second frequency terminal around the frequency of 5 GHz are still lower than −20 dB, which means the parasitic capacitor formed by the diodes does not cause significant influence on the frequency responses of the antenna terminal and the second frequency terminal around the frequency of 5 GHz.

Figure 5:
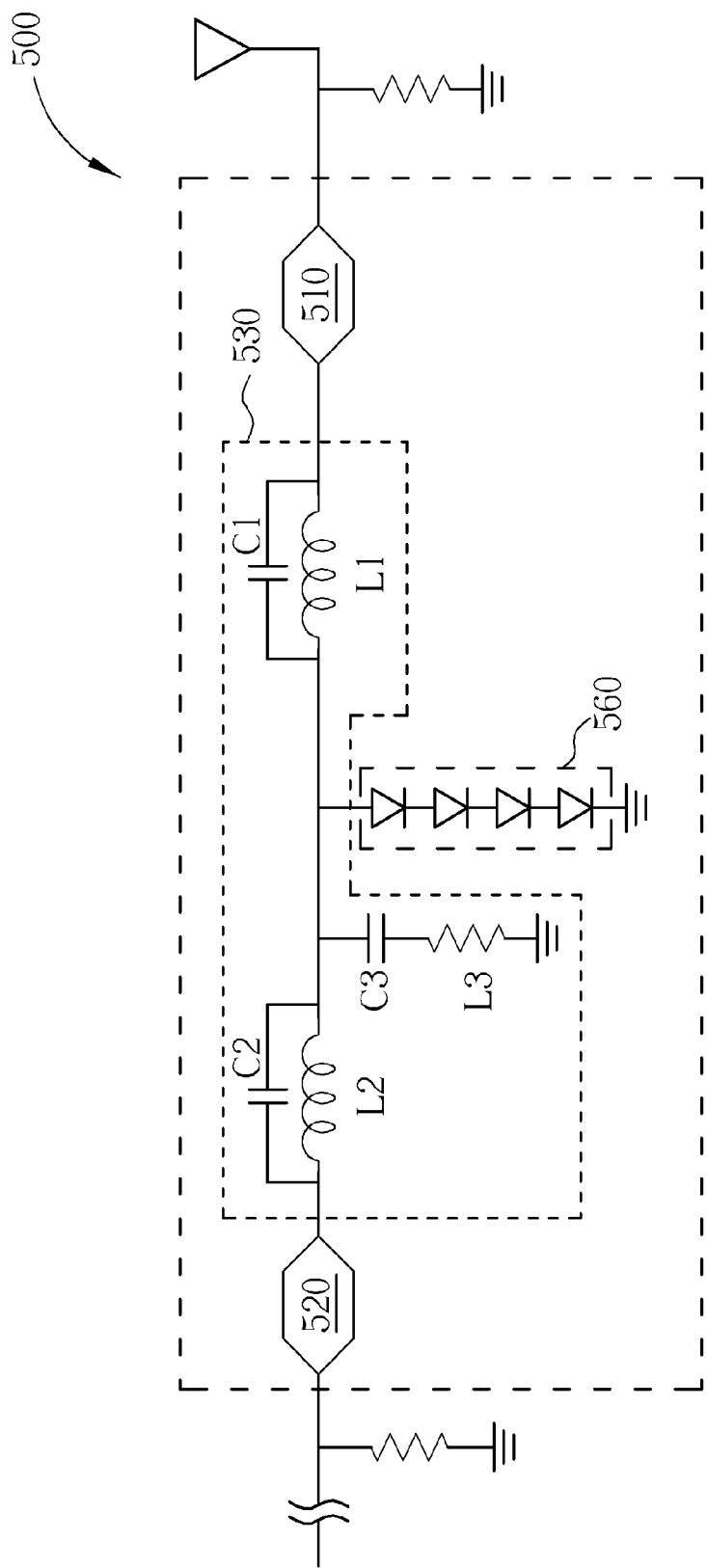
FIG. 5 is a diagram showing an electrostatic discharge protection mechanism of another integrated passive device of the present invention.

Please refer to FIG. 5. FIG. 5 is a diagram showing an electrostatic discharge protection mechanism of another integrated passive device of the present invention. The integrated passive device 500 is a harmonic filter. The integrated passive device 500 comprises an antenna terminal 510, a predetermined frequency terminal 520, a filtering circuit 530, and an electrostatic discharge protection element 560. The antenna terminal 510 is for receiving and transmitting a wireless signal. The predetermined frequency terminal 520 is for receiving and transmitting a signal with a predetermined frequency, such as a signal with a 2.5 GHz frequency. The filtering circuit 530 comprises a first capacitor C1, a first inductor L1, a second capacitor C2, a second inductor L2, a third capacitor C3, and a third inductor L3. A first end of the first capacitor C1 is electrically connected to the antenna terminal 510. A first end of the second capacitor C2 is electrically connected to a second end of the first capacitor C1, and a second end of the second capacitor C2 is electrically connected to the predetermined frequency terminal 520. The first inductor L1 is electrically connected to the first capacitor C1 in parallel. The second inductor L2 is electrically connected to the second capacitor C2 in parallel. A first end of the third capacitor C3 is electrically connected to the second end of the first capacitor C1. A first end of the third inductor L3 is electrically connected to a second end of the third capacitor C3, and a second end of the third inductor L3 is electrically connected to ground.

Similarly, as shown in FIG. 5, in order to prevent the capacitor elements C of the filtering circuit 530 from being damaged by the static electricity, the first inductor L1 allows current to pass through for protecting the first capacitor C1 from the static electricity, and the second inductor L2 allows current to pass through for protecting the second capacitor C2 from the static electricity. In addition, a first end of the electrostatic discharge protection element 560 is electrically connected to the second end of the first capacitor C1, and a second end of the electrostatic discharge protection element 560 is electrically connected to ground. The electrostatic discharge protection element 560 comprises a plurality of diodes electrically connected to each other in series for conducting the static electricity to ground for protecting the third capacitor C3 from the static electricity. Although the diodes of the electrostatic discharge protection element 560 form a parasitic capacitor, the parasitic capacitor formed by the diodes is electrically connected to the third capacitor C3 in parallel, such that the third capacitor C3 and the parasitic capacitor can be seemed as a single capacitor with capacitance equal to summation of capacitance of the third capacitor C3 and the parasitic capacitor. The integrated passive device 500 can adjust the capacitance of the third capacitor C3 to reduce influence of frequency response caused by the parasitic capacitor. According to the above arrangement, the parasitic capacitor formed by the diodes does not cause significant influence on frequency response of the filtering circuit 530 at higher frequency.

In contrast to the prior art, the electrostatic discharge protection element of the integrated passive device of the present invention is electrically connected to the capacitor of the filtering circuit in parallel, such that the influence on frequency response of the filtering circuit is reduced. Therefore, the frequency response of the integrated passive device still can meet the design requirement when utilizing the electrostatic discharge protection mechanism.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated passive device with electrostatic discharge protection mechanism, comprising:
   an antenna terminal, for receiving and transmitting a wireless signal;
   a first frequency terminal, for receiving and transmitting a signal with a first frequency;
   a first filtering circuit, for filtering the wireless signal, the first filtering circuit comprising:
      a first filtering element, with a first end electrically connected to the antenna terminal;
      a second filtering element, with a first end electrically connected to a second end of the first filtering element, and a second end electrically connected to the first frequency terminal; and
      a third filtering element, with a first end electrically connected to the second end of the first filtering element, and a second end electrically connected to ground; and
   an electrostatic discharge protection element, with a first end electrically connected to the second end of the first filtering element, and a second end electrically connected to ground, for conducting static electricity to ground.

2. The integrated passive device of claim 1, wherein the electrostatic discharge protection element comprises a plurality of diodes electrically connected to each other in series.

3. The integrated passive device of claim 1, wherein the first filtering element comprises:

a first capacitor, with a first end electrically connected to the antenna terminal, and a second end electrically connected to the first end of the second filtering element; and
a first inductor, with a first end electrically connected to the antenna terminal, and a second end electrically connected to the first end of the second filtering element.

4. The integrated passive device of claim 3, wherein the second filtering element comprises:
   a second capacitor, with a first end electrically connected to the second end of the first capacitor, and a second end electrically connected to the first frequency terminal; and
   a second inductor, with a first end electrically connected to the second end of the first capacitor, and a second end electrically connected to the first frequency terminal.

5. The integrated passive device of claim 4, wherein the third filtering element comprises:
   a third capacitor, with a first end electrically connected to the second end of the first capacitor; and
   a third inductor, with a first end electrically connected to a second end of the third capacitor, and a second end electrically connected to ground.

6. The integrated passive device of claim 1, being a harmonic filter.

7. The integrated passive device of claim 1, further comprising:
   a second frequency terminal, for receiving and transmitting a signal with a second frequency; and
   a second filtering circuit, electrically connected between the antenna terminal and the second frequency terminal for filtering the wireless signal.

8. The integrated passive device of claim 7, wherein the second filtering circuit comprises:
   a fourth filtering element, with a first end electrically connected to the antenna terminal; and
   a fifth filtering element, with a first end electrically connected to a second end of the fourth filtering element, and a second end electrically connected to the second frequency terminal.

9. The integrated passive device of claim 8, wherein the fourth filtering element comprises:
   a fourth capacitor, with a first end electrically connected to the antenna terminal;
   a fifth capacitor, with a first end electrically connected to a second end of the fourth capacitor;
   a fourth inductor, with a first end electrically connected to the second end of the fourth capacitor;
   a sixth capacitor, with a first end electrically connected to a second end of the fourth inductor; and
   a fifth inductor, with a first end electrically connected to a second end of the sixth capacitor, and a second end electrically connected to ground.

10. The integrated passive device of claim 9, wherein the fifth filtering element comprises:
    a seventh capacitor, with a first end electrically connected to a second end of the fifth capacitor;
    a sixth inductor, with a first end electrically connected to the second end of the fifth capacitor;
    an eighth capacitor, with a first end electrically connected to a second end of the seventh capacitor, and a second end electrically connected to the second frequency terminal; and
    a seventh inductor, with a first end electrically connected to the second end of the seventh capacitor, and a second end electrically connected to the second frequency terminal.

11. The integrated passive device of claim 9, wherein the fifth filtering element comprises:

a seventh capacitor, with a first end electrically connected to a second end of the fifth capacitor, and a second end electrically connected to the second frequency terminal; and a sixth inductor, with a first end electrically connected to the second end of the fifth capacitor, and a second end electrically connected to the second frequency terminal.

12. The integrated passive device of claim 7, wherein the first frequency is lower than the second frequency.

13. The integrated passive device of claim 7, being a duplexer filter.

* * * * *